(12) United States Patent
Chen et al.

(10) Patent No.: US 9,589,871 B2
(45) Date of Patent: Mar. 7, 2017

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Tang-Yuan Chen, Kaohsiung (TW); Chin-Li Kao, Kaohsiung (TW); Kuo-Hua Chen, Kaohsiung (TW); Ming-Hung Chen, Kaohsiung (TW); Dao-Long Chen, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/685,529

(22) Filed: Apr. 13, 2015

(65) Prior Publication Data

US 2016/0300782 A1 Oct. 13, 2016

(51) Int. Cl.
| H01L 23/49 | (2006.01) |
| H01L 23/495 | (2006.01) |
| H01L 23/00 | (2006.01) |
| H01L 23/31 | (2006.01) |
| H01L 21/48 | (2006.01) |
| H01L 21/56 | (2006.01) |

(52) U.S. Cl.
CPC .... *H01L 23/49548* (2013.01); *H01L 21/4825* (2013.01); *H01L 21/565* (2013.01); *H01L 23/3114* (2013.01); *H01L 23/4952* (2013.01); *H01L 24/32* (2013.01); *H01L 24/83* (2013.01); *H01L 2224/32245* (2013.01); *H01L 2224/32502* (2013.01); *H01L 2224/83805* (2013.01); *H01L 2924/3511* (2013.01); *H01L 2924/3512* (2013.01)

(58) Field of Classification Search
CPC ............... H01L 23/495; H01L 2224/73265
See application file for complete search history.

(56) References Cited

U.S. PATENT DOCUMENTS

| 2004/0256706 A1* | 12/2004 | Nakashima | H01L 23/49562 257/678 |
| 2009/0194856 A1* | 8/2009 | Gomez | H01L 23/49503 257/675 |
| 2012/0286319 A1* | 11/2012 | Lee | H01L 33/642 257/99 |

* cited by examiner

*Primary Examiner* — Tran Tran
(74) *Attorney, Agent, or Firm* — Foley & Lardner LLP; Cliff Z. Liu

(57) ABSTRACT

The present disclosure relates to a semiconductor package structure and a method for manufacturing the same. The semiconductor package structure includes a leadframe and a semiconductor die. The leadframe includes a main portion and a protrusion portion. The semiconductor die is bonded to a first surface of the main portion. The protrusion portion protrudes from a second surface of the main portion. The position of the protrusion portion corresponds to the position of the semiconductor die.

14 Claims, 23 Drawing Sheets

SEMICONDUCTOR PACKAGE STRUCTURE AND METHOD FOR MANUFACTURING THE SAME

BACKGROUND

1. Technical Field

The present disclosure relates to a semiconductor package structure and a method for manufacturing the same. In particular, the present disclosure relates to a semiconductor package structure including an improved leadframe and a method for manufacturing the same.

2. Description of the Related Art

In general, plastic semiconductor package structures can be fabricated using leadframes. For example, a plastic semiconductor package structure can include a semiconductor die attached to a leadframe and encapsulated in a plastic encapsulant. The leadframe is used to support the semiconductor die during a molding process, and can provide internal traces and terminal leads for a completed semiconductor package.

However, the attachment of the semiconductor die to the leadframe can cause warpage and die cracking due to a coefficient of thermal expansion (CTE) mismatch between the leadframe and the semiconductor die, such as at manufacturing temperatures. Because a design trend in the semiconductor industry includes weight reduction and miniaturization of semiconductor products, the leadframe can be made thinner to produce smaller and lighter semiconductor products; however, correspondingly, warpage can increase.

In addition, for a semiconductor die encapsulated in a plastic encapsulant, heat generated by the semiconductor die during operation may not be dissipated efficiently, which can reduce the life of the semiconductor package.

SUMMARY

An aspect of the present disclosure relates to a semiconductor package structure. In an embodiment, the semiconductor package structure includes a leadframe and a semiconductor die. The leadframe includes a main portion and a protrusion portion. The main portion has a first surface and a second surface. The protrusion portion protrudes from the second surface of the main portion. The semiconductor die is bonded to the first surface of the main portion. A position of the protrusion portion corresponds to a position of the semiconductor die.

Another aspect of the present disclosure relates to a semiconductor package structure. In an embodiment, the semiconductor package structure includes a leadframe and a semiconductor die. The leadframe has a first thickness at a first position and a second thickness at a second position. The first position is different from the second position. The first thickness is greater than the second thickness. The semiconductor die is bonded to the leadframe. The first position corresponds to a position of the semiconductor die.

Another aspect of the present disclosure relates to a method for manufacturing a semiconductor package structure. In an embodiment, the method includes (a) providing a leadframe; (b) removing a portion of the leadframe so that the leadframe includes a main portion and a protrusion portion, wherein the main portion has a first surface and a second surface, and the protrusion portion protrudes from the second surface of the main portion; (c) bonding a semiconductor die to the main portion, wherein a position of the protrusion portion corresponds to a position of the semiconductor die; (d) forming a first insulator to cover the semiconductor die and a portion of the first surface of the main portion; and (e) forming a conductive pattern on the first insulator, wherein the conductive pattern is electrically connected to the semiconductor die.

Another aspect of the present disclosure relates to a method for forming a semiconductor package structure. In an embodiment, the method includes (a) providing a main portion having a first surface and a second surface; (b) bonding a semiconductor die to the main portion; (c) forming a first insulator and a second insulator, wherein the first insulator covers the semiconductor die and a portion of the first surface of the main portion, and the second insulator covers the second surface of the main portion; (d) forming at least one opening in the second insulator to expose a portion of the second surface of the main portion; (e) filling the opening with a conductive material, such as a metal or a metal alloy, to form a protrusion portion, wherein a position of the protrusion portion corresponds to a position of the semiconductor die; and (f) forming a conductive pattern on the first insulator, wherein the conductive pattern is electrically connected to the semiconductor die.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
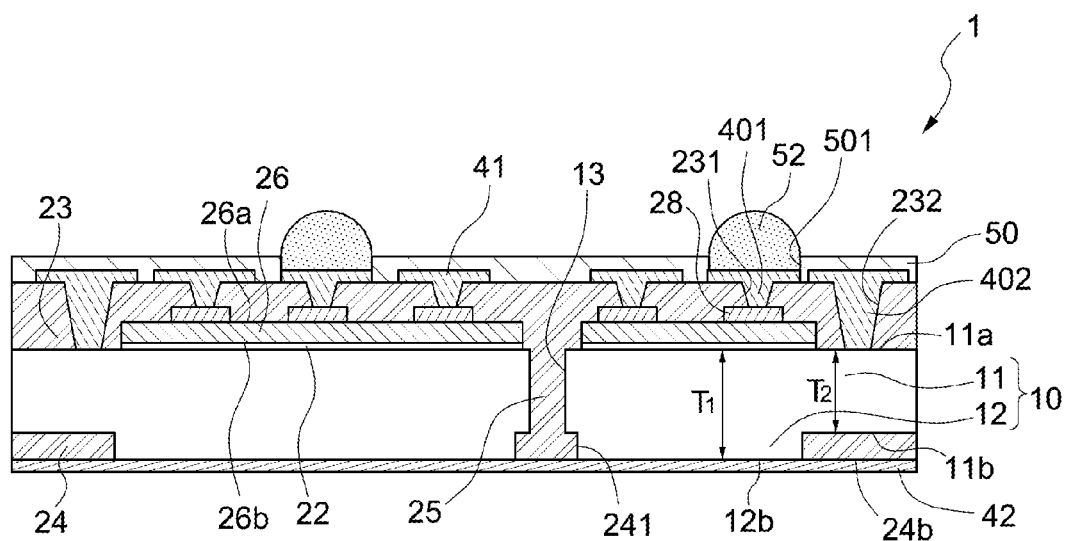
FIG. 1 is a cross-sectional view of a semiconductor package structure according to an embodiment of the present disclosure.

FIG. 1 is a cross-sectional view of a semiconductor package structure 1 according to an embodiment of the present disclosure. The semiconductor package structure 1 includes a leadframe 10, a bonding layer 22, one or more semiconductor dice 26, one or more first interconnection structures 401, one or more second interconnection structures 402, one or more first insulators 23, one or more second insulators 24, one or more third insulators 25, a first conductive pattern 41, an insulating layer 50, one or more conductive connects 52 and a metal layer 42.

The leadframe 10 includes a main portion 11 and one or more protrusion portions 12, and defines a trench 13. The material of the leadframe 10 is, for example, copper or other metal, or a metal alloy. The main portion 11 of the leadframe 10 has a first surface 11a and a second surface 11b. The second surface 11b of the main portion 11 is opposite to the first surface 11a of the main portion 11. The first surface 11a is the surface on which the semiconductor die 26 is bonded. In this embodiment, the main portion 11 and the protrusion portion 12 are integrally formed. For example, the leadframe 10 may be etched to form the protrusion portion 12 protruding from the main portion 11. The protrusion portion 12 is positioned below the semiconductor die 26. The protrusion portion 12 of the leadframe 10 has a third surface 12b. The leadframe 10 has a first thickness T1 at a first position corresponding to the position of the protrusion portion 12 and the semiconductor die 26, and a second thickness T2 at a second position. The first position is different from the second position, and the first thickness T1 is greater than the second thickness T2. In this embodiment, the difference between the first thickness T1 and the second thickness T2 is in a range of about 10 μm to about 50 μm. The protrusion portion 12 may be a pattern from a bottom view, as discussed below with respect to examples illustrated in FIGS. 2A-2O. The trench 13 extends through the main portion 11.

The semiconductor die 26 is bonded to the first surface 11a of the main portion 11 through the bonding layer 22. The semiconductor die 26 has an active surface 26a, a back surface 26b, and one or more bonding pads 28 disposed on the active surface 26a. In some embodiments, the back surface 26b of the semiconductor die 26 is bonded to the first surface 11a of the main portion 11 through the bonding layer 22 by eutectic bonding. The bonding layer 22 may include gold, tin, or a eutectic alloy thereof.

The first insulator 23 covers the semiconductor die 26 and a portion of the first surface 11a of the main portion 11 of the leadframe 10. The first insulator 23 defines one or more first openings 231 to expose the bonding pads 28 of the semiconductor die 26, and one or more second openings 232 to expose the first surface 11a of the main portion 11. The material of the first insulator 23 may be, for example, polypropylene or other suitable insulator material. The first interconnection structure 401 is disposed in the first opening 231, and the second interconnection structure 402 is disposed in the second opening 232. The first conductive pattern 41 is disposed on the first insulator 23, is electrically connected to the bonding pads 28 of the semiconductor die 26 through the first interconnection structure 401, and is electrically connected to the first surface 11a of the main portion 11 through the second interconnection structure 402. The material of the first conductive pattern 41, the first interconnection structure 401 and the second interconnection structure 402 may be the same or may be different. For example, the material of one or more of the first conductive pattern 41, the first interconnection structure 401 and the second interconnection structure 402 may be copper or other metal, or a metal alloy. In some embodiments, the first conductive pattern 41, the first interconnection structure 401 and the second interconnection structure 402 are formed at substantially the same time using the same material; for example, by plating. In other embodiments, the first conductive pattern 41, the first interconnection structure 401 and the second interconnection structure 402 are formed of different materials, and/or at different times.

The insulating layer 50 covers the first insulator 23 and the first conductive pattern 41, and defines one or more openings 501 to expose a portion of the first conductive pattern 41. In some embodiments, the material of the insulating layer 50 is a solder mask; however, other insulating materials may be used additionally or alternatively. The conductive connects 52 (e.g., solder balls) are disposed in the openings 501 on the exposed portion of the first conductive pattern 41, for external connection.

The second insulator 24 covers a portion of the second surface 11*b* of the main portion 11 of the leadframe 10, and has an opening 241 in which the protrusion portion 12 of the leadframe 10 is disposed. The second insulator 24 has a fourth surface 24*b*. The third insulator 25 is disposed in the trench 13. In some embodiments, the first insulator 23, the second insulator 24 and the third insulator 25 are the same material, such as polypropylene, or other suitable insulator material. In other embodiments, the first insulator 23, the second insulator 24 and the third insulator 25 may be formed of different materials. The protrusion portion 12 of the leadframe 10 is exposed from the second insulator 24. It is noted that the opening 241 may be a pattern corresponding to a configuration of the protrusion portion 12 from a bottom view. In some embodiments, the third surface 12*b* of the protrusion portion 12 is substantially coplanar with the fourth surface 24*b* of the second insulator 24. The metal layer 42 covers the third surface 12*b* of the protrusion portion 12 and the fourth surface 24*b* of the second insulator 24. The metal layer 42 may be formed, for example, by plating, such as by copper plating.

In the embodiment of FIG. 1, the position of the protrusion portion 12 of the leadframe 10 corresponds to the position of the semiconductor die 26, such that the leadframe 10 is thicker below the semiconductor die 26. In such manner, the rigidity and strength of the leadframe 10 below the semiconductor die 26 is increased, providing for reduced warpage of leadframe 10 when the semiconductor die 26 is attached, and thereby reducing a probability of cracking of the semiconductor die 26 in manufacturing temperatures. In addition, the semiconductor die 26 is attached to the first surface 11*a* of the main portion 11, and the metal layer 42 contacts the third surface 12*b* of the protrusion portion 12. Thus, the heat generated by the semiconductor die 26 during operation can be dissipated through the leadframe 10 and the metal layer 42.

Figure 2A:
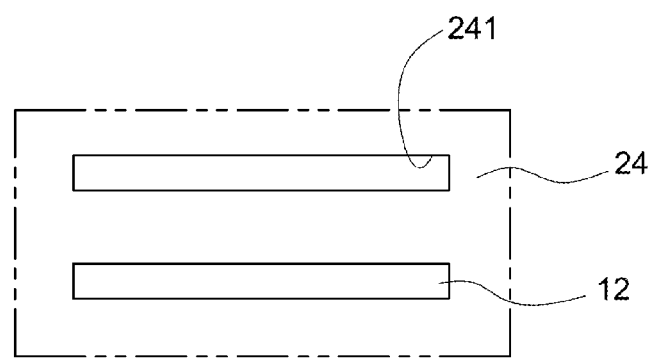
FIG. 2A is a partial bottom view of the semiconductor package structure illustrated in FIG. 1 according to an embodiment of the present disclosure.
Figure 2B:
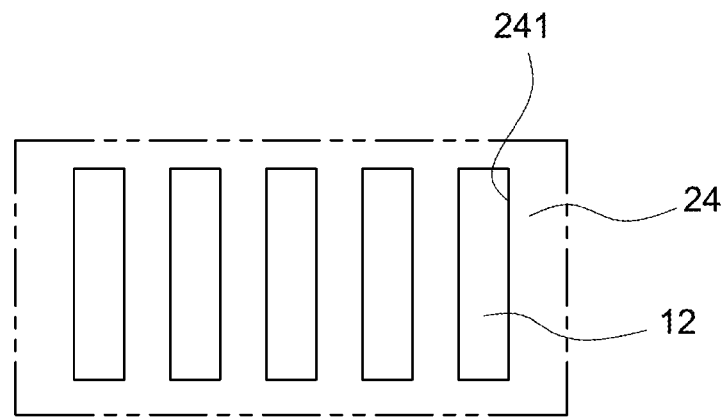
FIG. 2B is a partial bottom view of the semiconductor package structure illustrated in FIG. 1 according to another embodiment of the present disclosure.
Figure 2C:
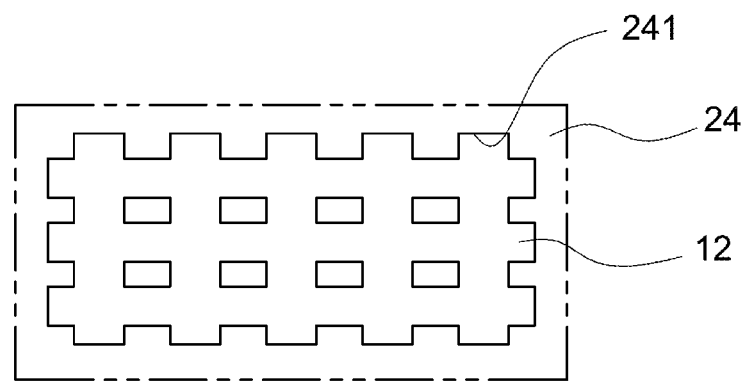
FIG. 2C is a partial bottom view of the semiconductor package structure illustrated in FIG. 1 according to another embodiment of the present disclosure.
Figure 2D:
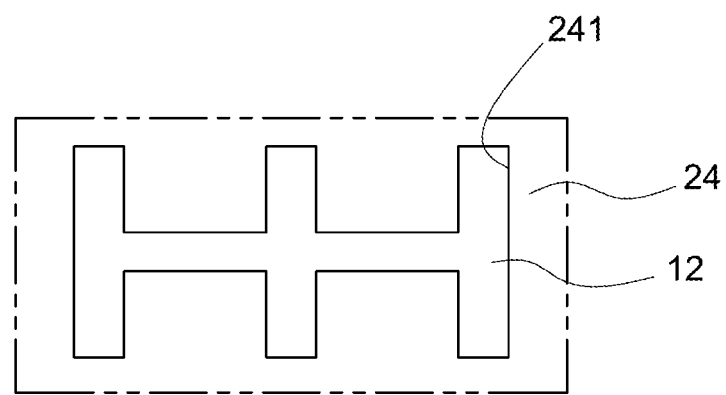
FIG. 2D is a partial bottom view of the semiconductor package structure illustrated in FIG. 1 according to another embodiment of the present disclosure.
Figure 2E:
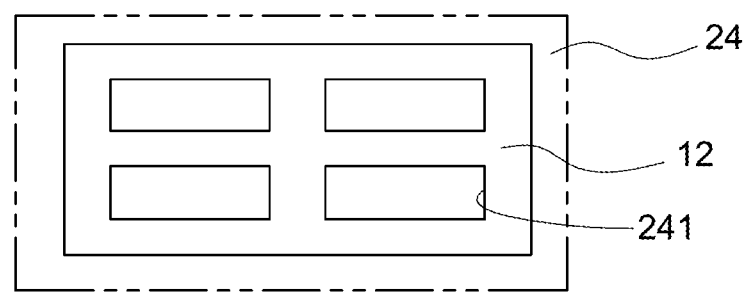
FIG. 2E is a partial bottom view of the semiconductor package structure illustrated in FIG. 1 according to another embodiment of the present disclosure
Figure 2F:
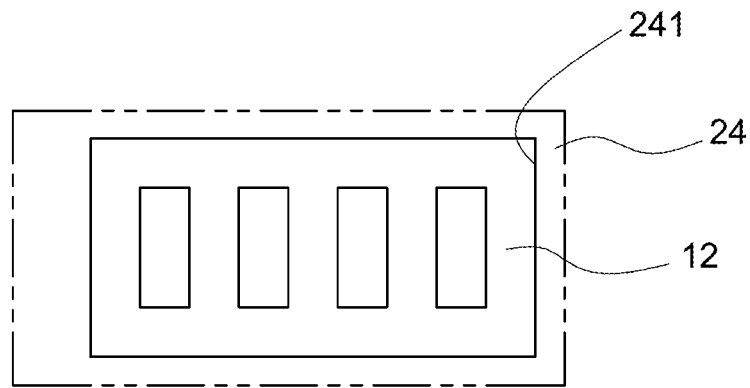
FIG. 2F is a partial bottom view of the semiconductor package structure illustrated in FIG. 1 according to another embodiment of the present disclosure.
Figure 2G:
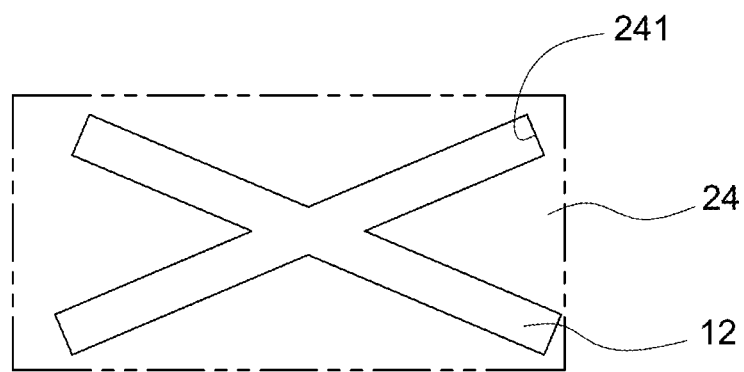
FIG. 2G is a partial bottom view of the semiconductor package structure illustrated in FIG. 1 according to another embodiment of the present disclosure.
Figure 2H:
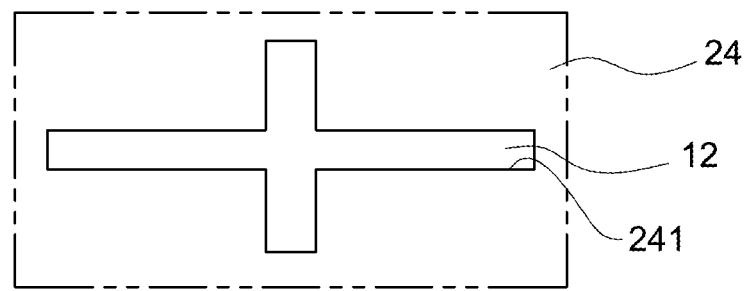
FIG. 2H is a partial bottom view of the semiconductor package structure illustrated in FIG. 1 according to another embodiment of the present disclosure.
Figure 2I:
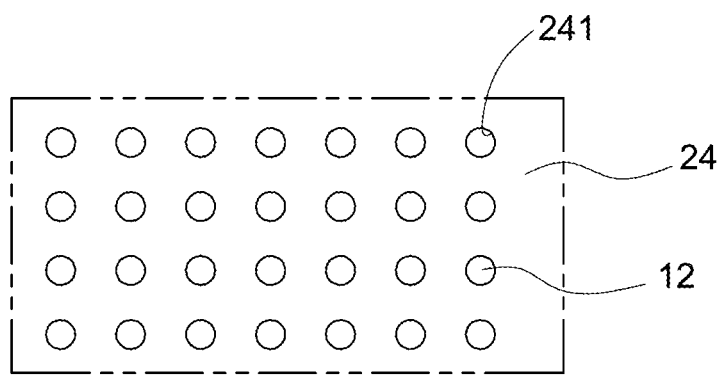
FIG. 2I is a partial bottom view of the semiconductor package structure illustrated in FIG. 1 according to another embodiment of the present disclosure.
Figure 2J:
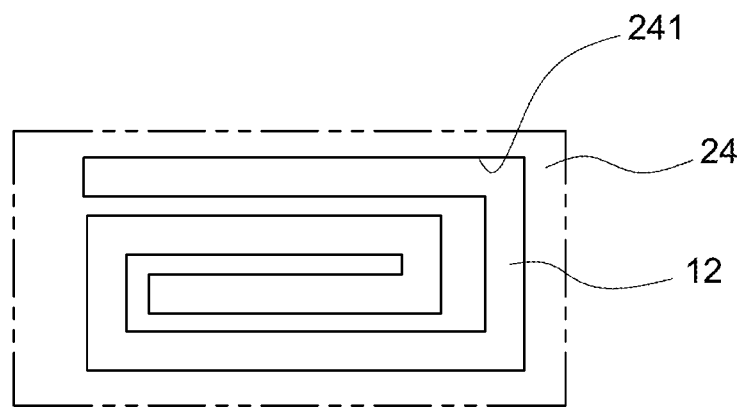
FIG. 2J is a partial bottom view of the semiconductor package structure illustrated in FIG. 1 according to another embodiment of the present disclosure.
Figure 2K:
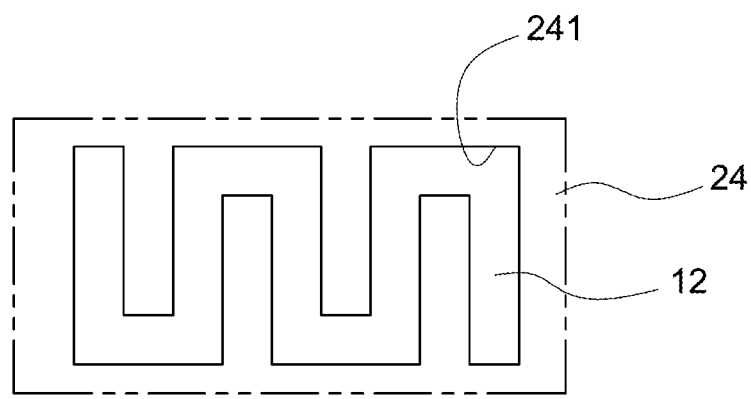
FIG. 2K is a partial bottom view of the semiconductor package structure illustrated in FIG. 1 according to another embodiment of the present disclosure.
Figure 2L:
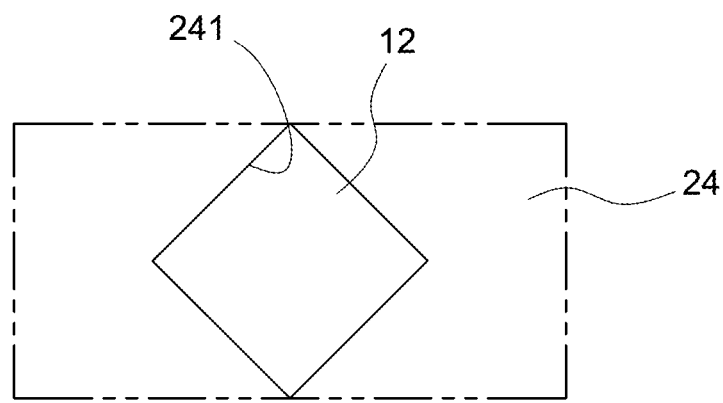
FIG. 2L is a partial bottom view of the semiconductor package structure illustrated in FIG. 1 according to another embodiment of the present disclosure.
Figure 2M:
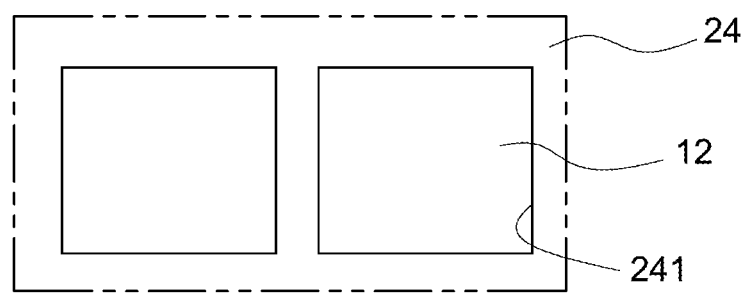
FIG. 2M is a partial bottom view of the semiconductor package structure illustrated in FIG. 1 according to another embodiment of the present disclosure.
Figure 2N:
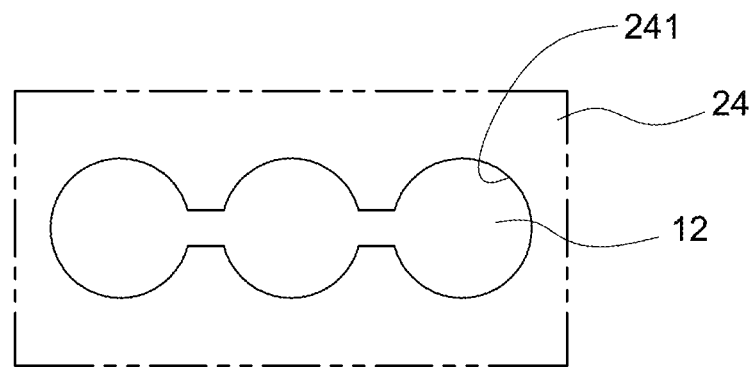
FIG. 2N is a partial bottom view of the semiconductor package structure illustrated in FIG. 1 according to another embodiment of the present disclosure.
Figure 2O:
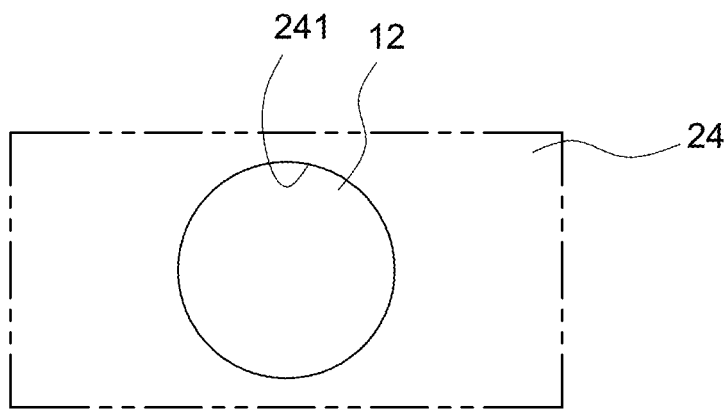
FIG. 2O is a partial bottom view of the semiconductor package structure illustrated in FIG. 1 according to another embodiment of the present disclosure.

FIGS. 2A-2O illustrate partial bottom views of the semiconductor package structure 1 illustrated in FIG. 1 according to embodiments of the present disclosure, wherein the metal layer 42 is omitted from the illustrations to show the protrusion portion 12 and the second insulator 24. In each of FIGS. 2A-2O, a pattern of the protrusion portion 12 is illustrated by way of example; in other embodiments, other patterns may be implemented. Further, a semiconductor package structure may include two or more different patterns of the protrusion portion 12, such as two or more of the patterns illustrated in FIGS. 2A-2O.

FIG. 2A illustrates the protrusion portion 12 as a pattern including parallel strips extending along a first direction.

FIG. 2B illustrates the protrusion portion 12 as a pattern including parallel strips extending along a second direction, and the second direction is different from (e.g., perpendicular to) the first direction.

FIG. 2C illustrates the protrusion portion 12 as a pattern including crossed strips that form a first type of grid.

FIG. 2D illustrates the protrusion portion 12 as a pattern including crossed strips that form a second type of grid (e.g., resembling a fence).

FIG. 2E illustrates the protrusion portion 12 as a pattern including crossed strips within a frame.

FIG. 2F illustrates the protrusion portion 12 as a pattern including parallel strips within a frame.

FIG. 2G illustrates the protrusion portion 12 as a pattern including two non-perpendicular intersecting strips.

FIG. 2H illustrates the protrusion portion 12 as a pattern including two perpendicular intersecting strips.

FIG. 2I illustrates the protrusion portion 12 as a pattern including circular structures arranged in an array.

FIG. 2J illustrates the protrusion portion 12 as a pattern including a spiral strip.

FIG. 2K illustrates the protrusion portion 12 as a pattern including a strip that alternates direction (e.g., in a snake pattern).

FIG. 2L illustrates the protrusion portion 12 as a pattern including a diamond shape.

FIG. 2M illustrates the protrusion portion 12 as a pattern including square shapes.

FIG. 2N illustrates the protrusion portion 12 as a pattern including circles interconnected with strips.

FIG. 2O illustrates the protrusion portion 12 as a pattern including a circular shape.

Figure 3:
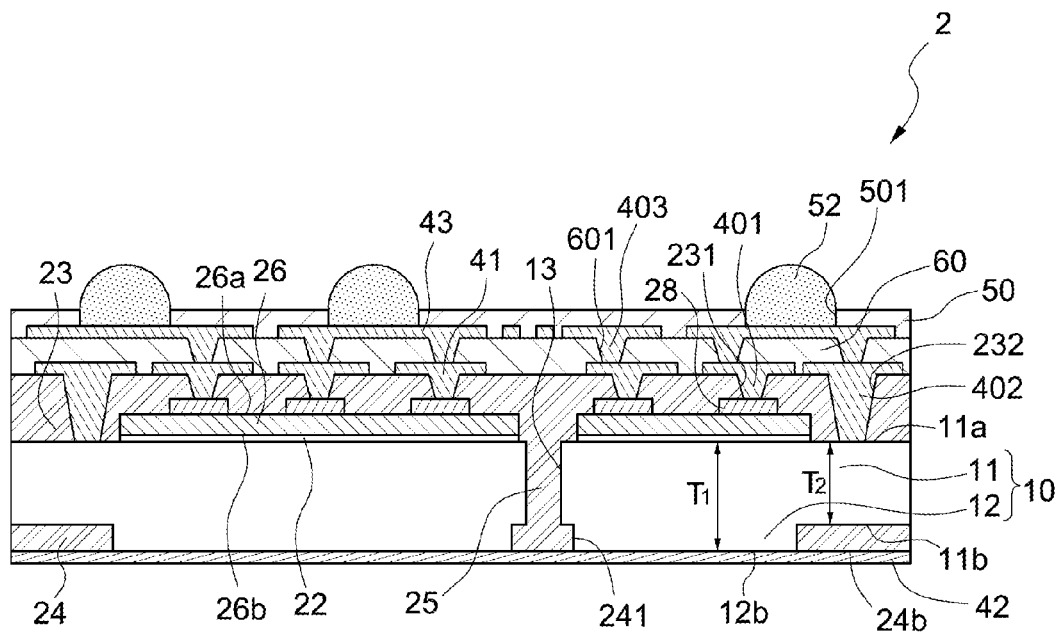
FIG. 3 is a cross-sectional view of a semiconductor package structure according to another embodiment of the present disclosure.

FIG. 3 is a cross-sectional view of a semiconductor package structure 2 according to another embodiment of the present disclosure. The semiconductor package structure 2 is similar to the semiconductor package structure 1 illustrated in FIG. 1, except that the semiconductor package structure 2 further includes an intermediate insulating layer 60, one or more third interconnection structures 403 and a second conductive pattern 43. The intermediate insulating layer 60 is disposed between the first insulator 23 and the insulating layer 50, and has one or more openings 601 to expose a portion of the first conductive pattern 41. The third interconnection structure 403 is disposed in the opening 601. The second conductive pattern 43 is disposed on the intermediate insulating layer 60, and is electrically connected to the first conductive pattern 41 through the third interconnection structure 403. In some embodiments, the second conductive pattern 43 and the third interconnection structure 403 are formed of the same material at substantially the same time; for example, by plating. In other embodiments, the second conductive pattern 43 and the third interconnection structure 403 are formed of different materials, and/or at different times The material of the second conductive pattern 43 and/or the third interconnection structure 403 is, for example, copper or other metal, or a metal alloy.

The insulating layer 50 covers the intermediate insulating layer 60 and the second conductive pattern 43, and defines one or more openings 501 to expose a portion of the second conductive pattern 43. The material of the insulating layer 50 is, for example, a solder mask or other suitable insulating material. The conductive connects 52 (e.g., solder balls) are disposed in respective openings 501 on the exposed portion of the second conductive pattern 43, for external connection.

Figure 4:
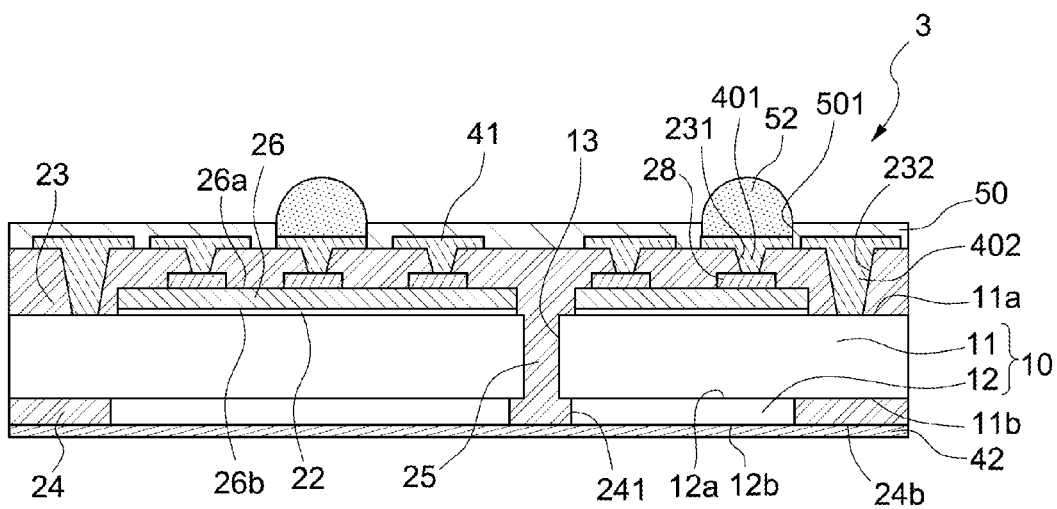
FIG. 4 is a cross-sectional view of a semiconductor package structure according to another embodiment of the present disclosure.

FIG. 4 is a cross-sectional view of a semiconductor package structure 3 according to another embodiment of the present disclosure. The semiconductor package structure 3 is similar to the semiconductor package structure 1 illustrated in FIG. 1, except that the main portion 11 and the protrusion portion 12 of the lead frame 10 are not integrally formed. For example, the protrusion portion 12 is formed by adding a conductive material, such as a metal or a metal alloy, on the main portion 11, such as by using a copper plating process. In the non-integral embodiment of FIG. 4, the protrusion portion 12 has a third surface 12*b* and a fifth surface 12*a* opposite to the third surface 12*b*. The fifth surface 12*a* of the protrusion portion 12 is disposed on the second surface 11*b* of the main portion 11.

Figure 5:
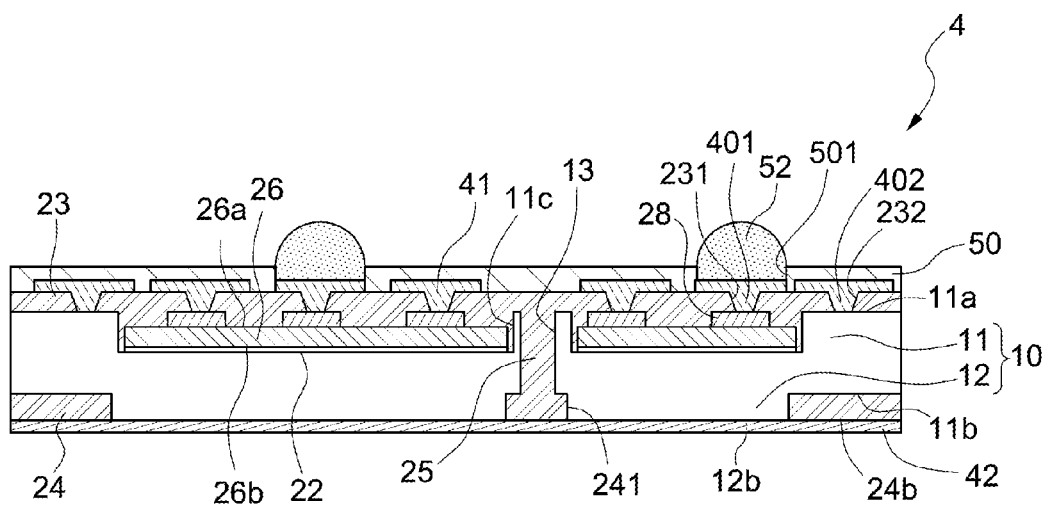
FIG. 5 is a cross-sectional view of a semiconductor package structure according to another embodiment of the present disclosure.

FIG. 5 is a cross-sectional view of a semiconductor package structure 4 according to another embodiment of the present disclosure. The semiconductor package structure 4 is similar to the semiconductor package structure 1 illustrated in FIG. 1, except that the main portion 11 further has one or more cavities 11c recessed below the first surface 11a of the main portion 11, and the semiconductor die 26 is disposed in the cavity 11c and bonded to a bottom wall of the cavity 11c. In some embodiments, the cavity 11c is formed by etching a portion of the first surface of the leadframe 10, and can be sized to partially or fully accommodate the semiconductor die 26. Because the semiconductor die 26 is disposed in the cavity 11c, the total thickness of the semiconductor package structure 4 is reduced. In the embodiment illustrated in FIG. 5, a top surface of the bonding pad 28 is substantially coplanar with the first surface 11a of the main portion 11, thus, the configuration of the first opening 231 is the same as that of the second opening 232, which facilitates the hole-forming process (e.g., a hole-drilling process).

FIGS. 6A-6G illustrate a method for manufacturing a semiconductor package structure according to an embodiment of the present disclosure.

Figure 6A:
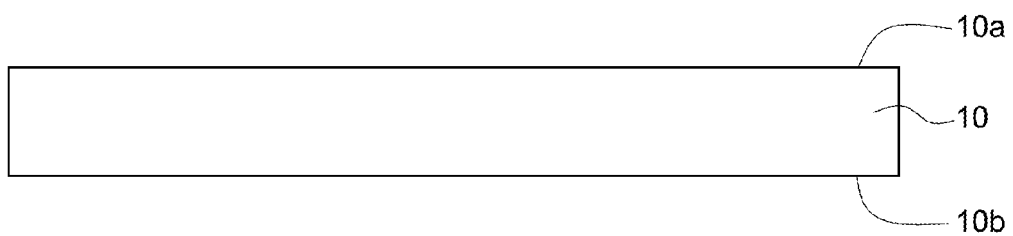
FIG. 6A, FIG. 6B, FIG. 6C, FIG. 6D, FIG. 6E, FIG. 6F and FIG. 6G illustrate a method for manufacturing a semiconductor package structure according to an embodiment of the present disclosure.

Referring to FIG. 6A, a leadframe 10 is provided. The leadframe 10 has an upper surface 10a and a lower surface 10b opposite to the upper surface 10a. The material of the leadframe 10 is, for example, copper or other metal, or a metal alloy.

Figure 6B:
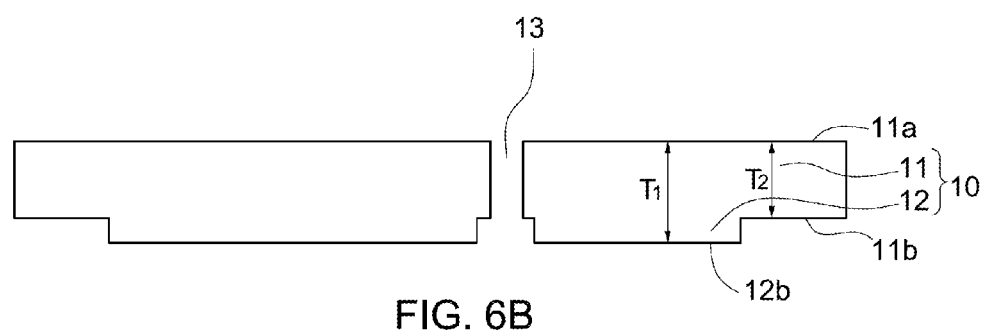

Referring to FIG. 6B, a portion of the leadframe 10 is removed so that the leadframe 10 includes a main portion 11, a protrusion portion 12 and a trench 13. The main portion 11 has a first surface 11a and a second surface 11b. The second surface 11b is opposite to the first surface 11a. The protrusion portion 12 protrudes from the second surface 11b of the main portion 11. In this embodiment, the protrusion portion 12 is formed by etching a portion of the lower surface 10b of the leadframe 10. The protrusion portion 12 has a third surface 12b. The leadframe 10 has a first thickness T1 at a first position corresponding to the position of the protrusion portion 12, and a second thickness T2 at a second position. The first position is different from the second position, and the first thickness T1 is greater than the second thickness T2. In this embodiment, the difference between the first thickness T1 and the second thickness T2 is in a range of about 10 μm to about 50 μm. The protrusion portion 12 may be a pattern from a bottom view, such as one or more of the patterns illustrated in FIGS. 2A-2O. The trench 13 extends through the main portion 11.

Figure 6C:
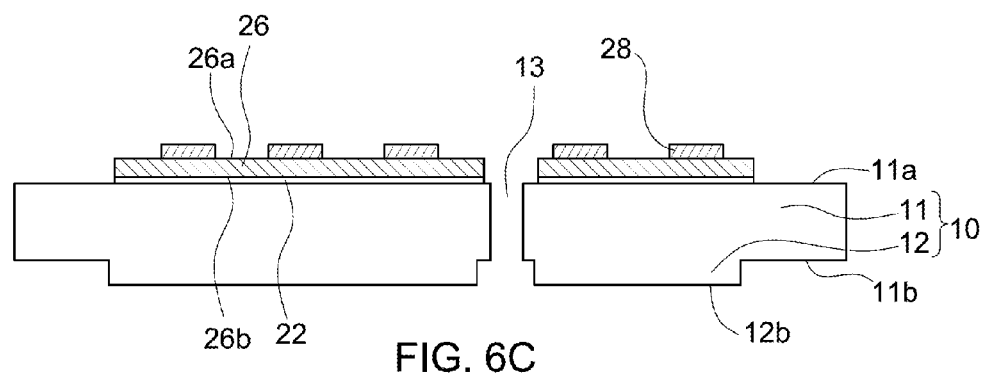

Referring to FIG. 6C, a semiconductor die 26 is bonded to the first surface 11a of the main portion 11 using a bonding layer 22. The position of the semiconductor die 26 corresponds to the position of the protrusion portion 12. The semiconductor die 26 has an active surface 26a, a back surface 26b, and one or more bonding pads 28 disposed on the active surface 26a. In some embodiments, the back surface 26b of the semiconductor die 26 is bonded to the first surface 11a of the main portion 11 through the bonding layer 22 by eutectic bonding. The bonding layer 22 may include gold, tin, or a eutectic alloy thereof.

Figure 6D:
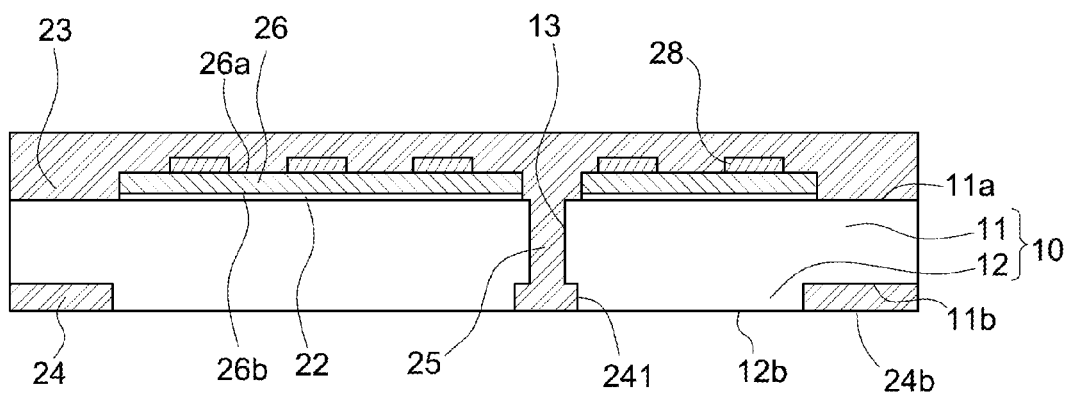

Referring to FIG. 6D, a first insulator 23 is formed to cover the semiconductor die 26 and a portion of the first surface 11a of the main portion 11. A second insulator 24 is formed to cover a portion of the second surface 11b of the main portion 11, such that an opening 241 in the second insulator 24 exposes the protrusion portion 12. The second insulator 24 has a fourth surface 24b. The third insulator 25 is formed in the trench 13. In some embodiments, the first insulator 23, the second insulator 24 and the third insulator 25 are the same material, such as polypropylene, and are formed at substantially the same time. That is, the first insulator 23 further enters the trench 13 and covers a portion of the second surface 11b of the main portion 11, and the protrusion portion 12 is exposed from the first insulator 23. In other embodiments, the first insulator 23, the second insulator 24 and the third insulator 25 may be different materials and/or formed at different times. It is noted that the opening 241 may be a pattern corresponding to the configuration of the protrusion portion 12 from a bottom view.

Figure 6E:
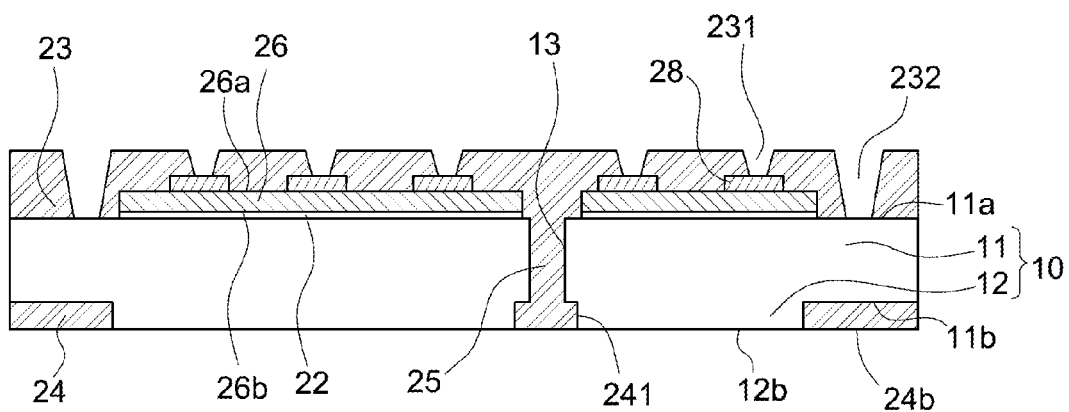

Referring to FIG. 6E, one or more first openings 231 are formed in the first insulator 23 to expose the bonding pads 28 of the semiconductor die 26, and one or more second openings 232 are formed in the first insulator 23 to expose the first surface 11a of the main portion 11. For example, the first openings 231 and the second openings 232 are formed by laser drilling.

Figure 6F:
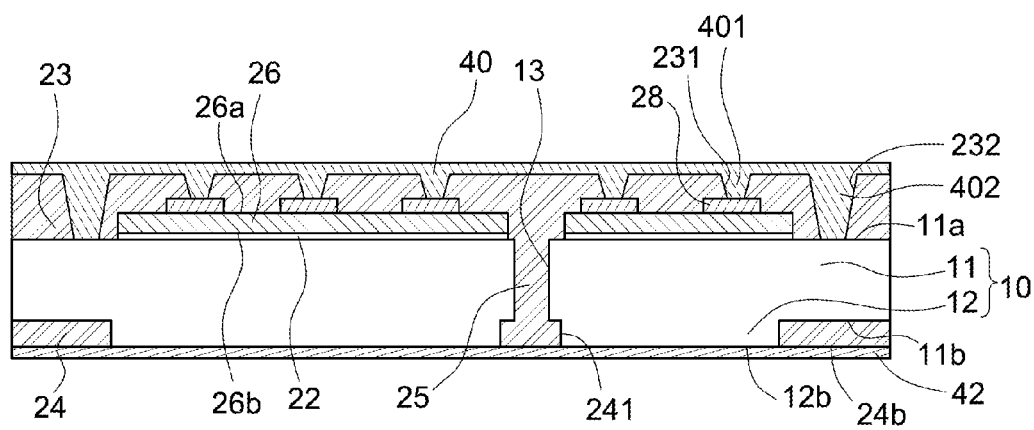

Referring to FIG. 6F, a conductive material 40 (e.g., copper) is disposed on the first insulator 23 and in the first openings 231 and the second openings 232; for example, by plating. The portion of the conductive material 40 that is disposed in a first opening 231 is defined as a first interconnection structure 401, and the portion of the conductive material 40 that is disposed in a second opening 232 is defined as a second interconnection structure 402. In addition, the metal layer 42 is formed to cover the third surface 12b of the protrusion portion 12 and the fourth surface 24b of the second insulator 24. In some embodiments, the conductive material 40 and the metal layer 42 are the same material, and are formed at substantially the same time. In other embodiments, the conductive material 40 and the metal layer 42 are formed of different materials, and/or at different times.

Figure 6G:
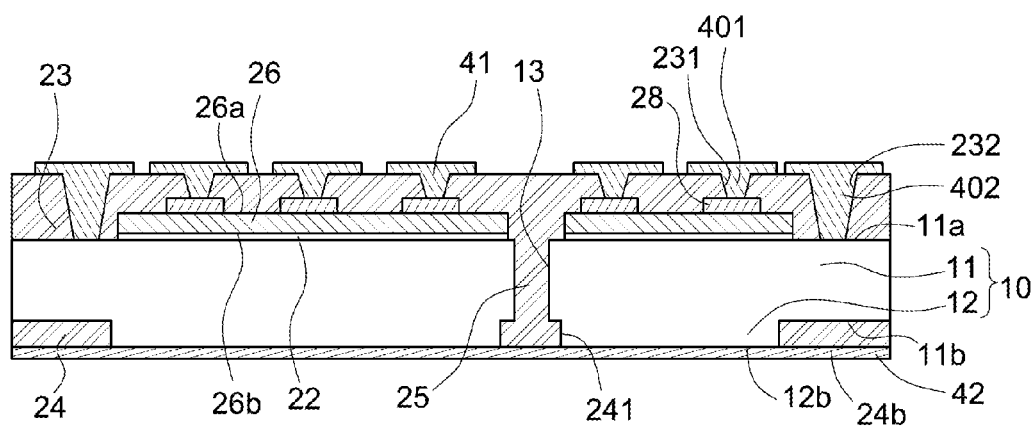

Referring to FIG. 6G, the conductive material 40 is patterned (for example, by selectively etching) to form the first conductive pattern 41. Therefore, the first conductive pattern 41 is disposed on the first insulator 23, electrically connected to the bonding pads 28 of the semiconductor die 26 through the first interconnection structure 401, and electrically connected to the first surface 11a of the main portion 11 of the leadframe 10 through the second interconnection structure 402.

Then, an insulating layer (e.g., the insulating layer 50 in FIG. 1) may be formed to cover the first insulator 23 and the first conductive pattern 41, and may define one or more openings (e.g., the openings 501 in FIG. 1) to expose a portion of the first conductive pattern 41. In some embodiments, such an insulating layer is a solder mask; however, other insulating materials may be used additionally or alternatively. Then, conductive connects (e.g., the conductive connects 52 in FIG. 1, such as solder balls) may be disposed in respective openings, on the exposed portion of the first conductive pattern 41, for external connection. Thus, the semiconductor package structure 1 as shown in FIG. 1 may be obtained.

FIGS. 7A-7D illustrate a method for manufacturing a semiconductor package structure according to another embodiment of the present disclosure. The initial portion of the method of this embodiment is similar to that described with respect to FIGS. 6A-6G, and the method illustrated in FIGS. 7A-7D is subsequent to the method described with respect to FIGS. 6A-6G.

Figure 7A:
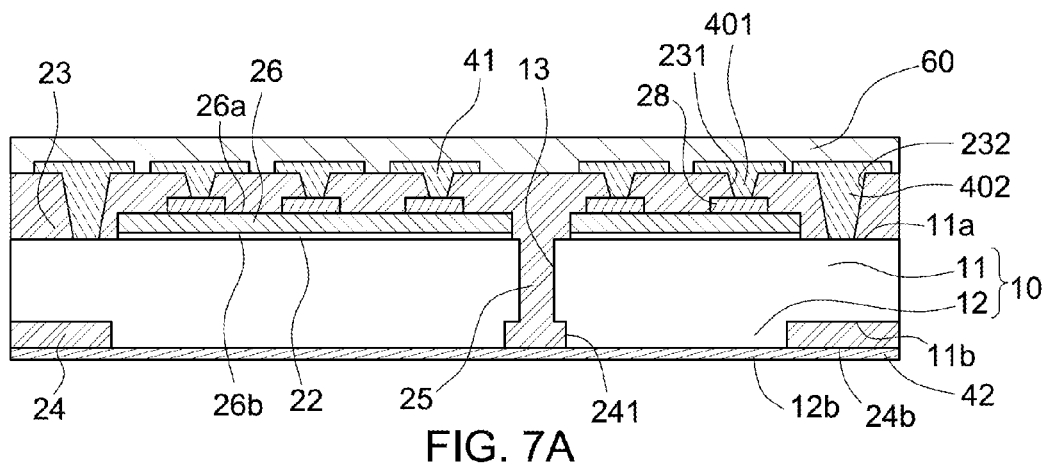
FIG. 7A, FIG. 7B, FIG. 7C and FIG. 7D illustrate a method for manufacturing a semiconductor package structure according to another embodiment of the present disclosure.

Referring to FIG. 7A, an intermediate insulating layer 60 is formed to cover the first insulator 23 and the first conductive pattern 41. The material of the intermediate insulating layer 60 may be same as, or different from, that of the first insulator 23.

Figure 7B:
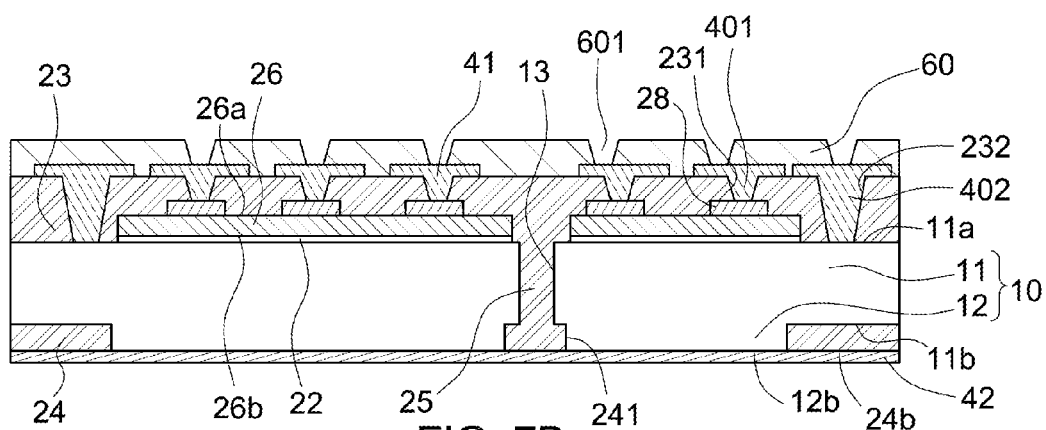

Referring to FIG. 7B, one or more openings 601 are formed on the intermediate insulating layer 60 to expose a portion of the first conductive pattern 41. For example, the openings 601 are formed by laser drilling.

Figure 7C:
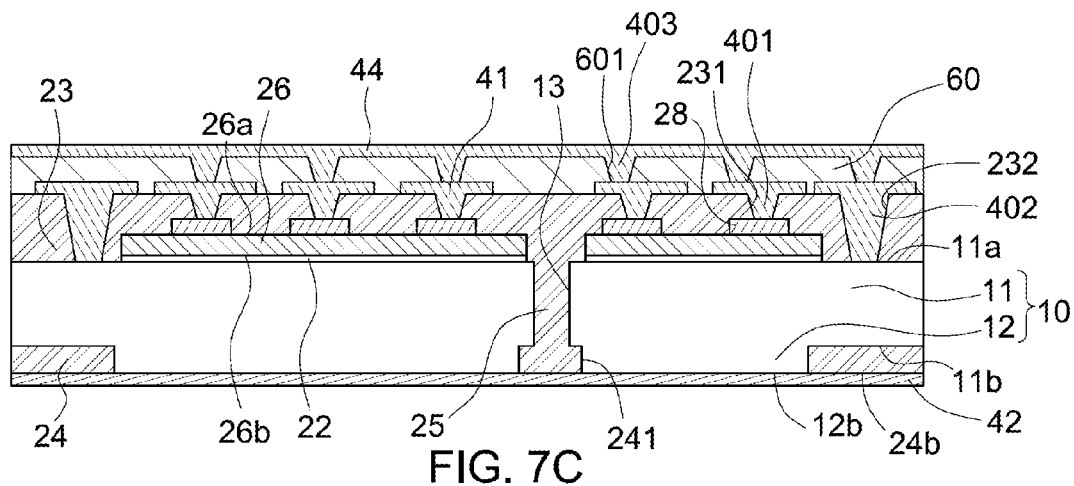

Referring to FIG. 7C, a conductive material 44 (e.g., copper) is disposed on the intermediate insulating layer 60 and in the openings 601; for example, by plating. The portion of the conductive material 44 that is disposed in an opening 601 is defined as a third interconnection structure 403.

Figure 7D:
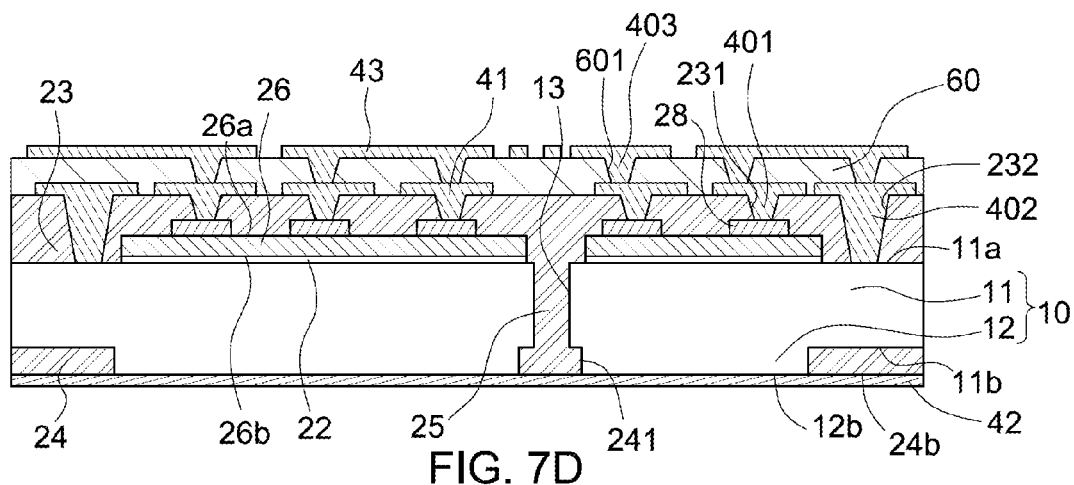

Referring to FIG. 7D, the conductive material 44 is patterned (for example, by selectively etching) to form a second conductive pattern 43. Therefore, the second conductive pattern 43 is disposed on the intermediate insulating layer 60, and is electrically connected to the first conductive pattern 41 through the third interconnection structure 403.

Then, an insulating layer (e.g., insulating layer 50 in FIG. 3) may be formed to cover the intermediate insulating layer 60 and the second conductive pattern 43. Such an insulating layer may define one or more openings (e.g., openings 501 in FIG. 3) to expose a portion of the second conductive pattern 43. In some embodiments, the material of the insulating layer is a solder mask; however, other insulating materials may be used additionally or alternatively. Then, conductive connects (e.g., conductive connects 52 in FIG. 3, such as solder balls) may be disposed in respective openings on the exposed portion of the second conductive pattern 43, for external connection. Thus, the semiconductor package structure 2 as shown in FIG. 3 may be obtained.

FIGS. 8A-8H illustrate a method for manufacturing a semiconductor package structure according to another embodiment of the present disclosure.

Figure 8A:
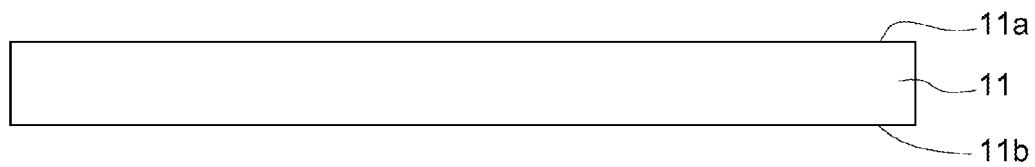
FIG. 8A, FIG. 8B, FIG. 8C, FIG. 8D, FIG. 8E, FIG. 8F, FIG. 8G and FIG. 8H illustrate a method for manufacturing a semiconductor package structure according to another embodiment of the present disclosure.

Referring to FIG. 8A, a main portion 11 of a leadframe 10 is provided. The main portion 11 has a first surface 11a and a second surface 11b opposite to the first surface 11a.

Figure 8B:
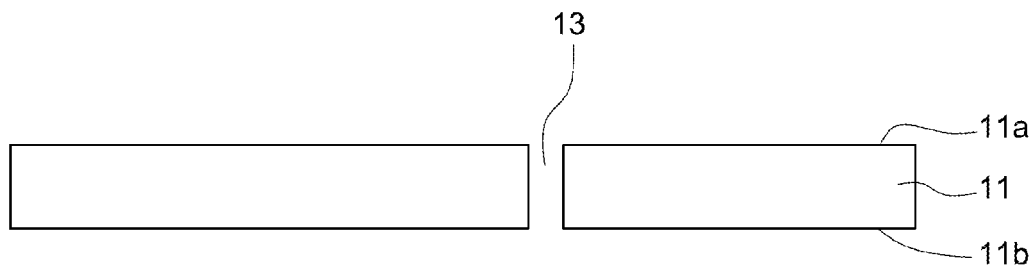

Referring to FIG. 8B, a trench 13 is formed to extend through the main portion 11; for example, by etching.

Figure 8C:
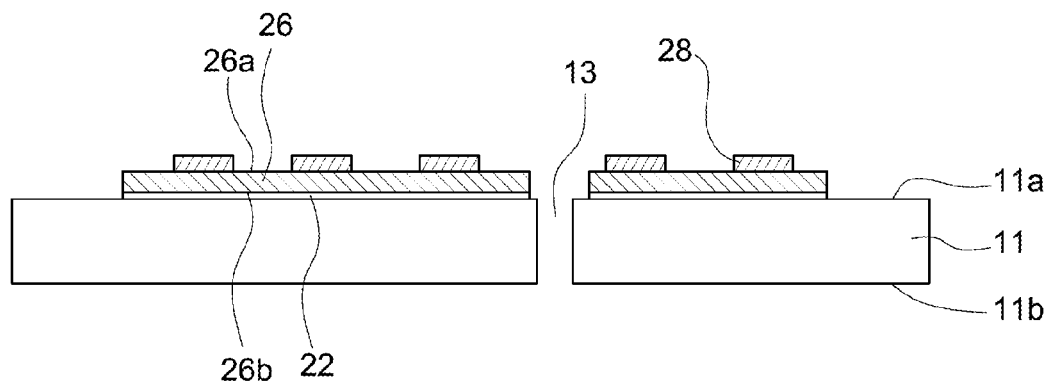

Referring to FIG. 8C, one or more semiconductor dice 26 are bonded to the first surface 11a of the main portion 11 through a bonding layer 22. A semiconductor die 26 has an active surface 26a, a back surface 26b, and one or more bonding pads 28 disposed on the active surface 26a. In some embodiments, the back surface 26b of the semiconductor die 26 is bonded to the first surface 11a of the main portion 11 through the bonding layer 22 by eutectic bonding. The bonding layer 22 may include gold, tin, or a eutectic alloy thereof.

Figure 8D:
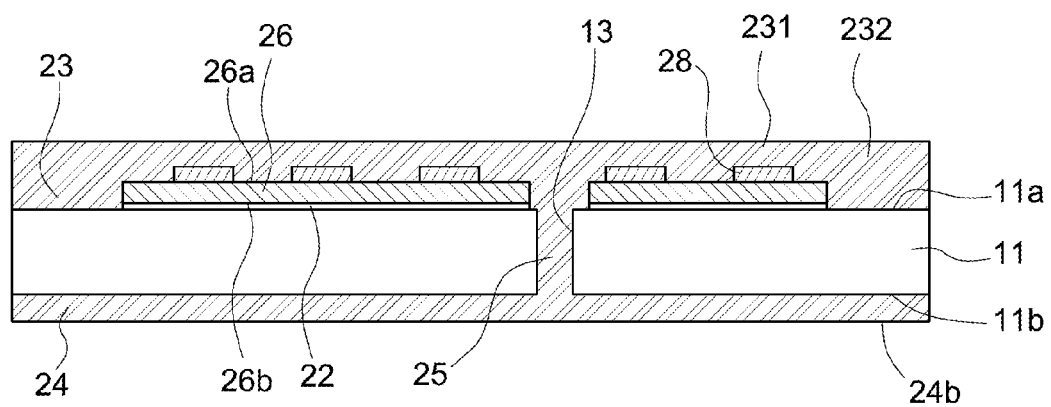

Referring to FIG. 8D, a first insulator 23 is formed to cover the semiconductor die 26 and a portion of the first surface 11a of the main portion 11. A second insulator 24 is formed to cover at least a portion of the second surface 11b of the main portion 11. The second insulator 24 has a fourth surface 24b. A third insulator 25 is formed in the trench 13. In some embodiments, the first insulator 23, the second insulator 24 and the third insulator 25 are the same material, such as polypropylene, and are formed at substantially the same time. That is, the first insulator 23 further enters the trench 13 and covers a portion of the second surface 11b of the main portion 11. In other embodiments, the first insulator 23, the second insulator 24 and the third insulator 25 may be formed of different materials, and/or formed at different times.

Figure 8E:
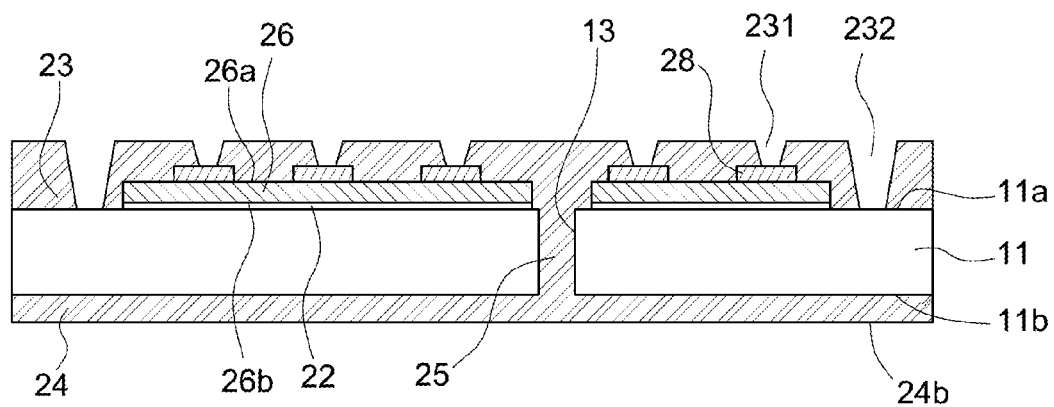

Referring to FIG. 8E, one or more openings are formed in the first insulator 23, so that the first insulator 23 defines one or more first openings 231 to expose the bonding pads 28 of the semiconductor die 26 and one or more second openings 232 to expose the first surface 11a of the main portion 11. For example, the first openings 231 and the second openings 232 are formed by laser drilling.

Figure 8F:
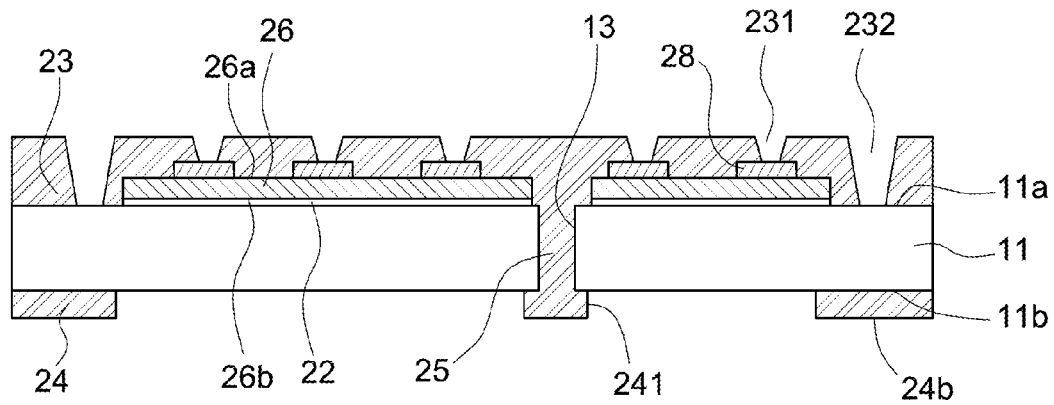

Referring to FIG. 8F, at least one opening 241 is formed in the second insulator 24 to expose a portion of the second surface 11b of the main portion 11. For example, the opening 241 is formed by laser drilling. The position of an opening 241 corresponds to a position of a respective semiconductor die 26. The opening 241 may be a pattern from a bottom view.

Figure 8G:
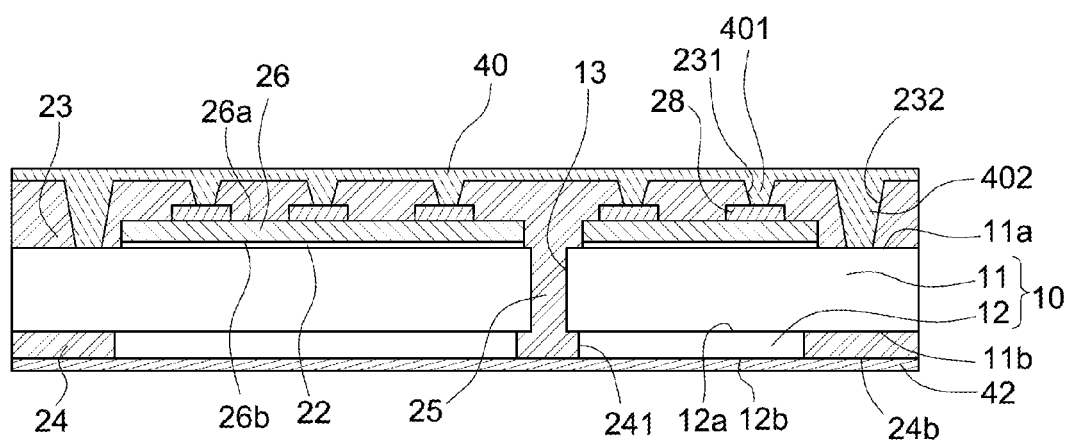

Referring to FIG. 8G, a conductive material 40 (e.g., copper) is formed on the first insulator 23 and in the first openings 231 and the second openings 232; for example, by plating. The portion of the conductive material 40 that is disposed in a first opening 231 is defined as a first interconnection structure 401, and the portion of the conductive material 40 that is disposed in a second opening 232 is defined as a second interconnection structure 402. Further, the conductive material 40 fills the opening 241 to form a protrusion portion 12 of the leadframe 10. A thickness of the protrusion portion 12 is in a range of about 10 μm to about 50 μm. The position of a protrusion portion 12 corresponds to a position of a respective semiconductor die 26. The protrusion portion 12 has a third surface 12b and a fifth surface 12a opposite to the third surface 12b. The fifth surface 12a is disposed on the second surface 11b of the main portion 11, and the third surface 12b is substantially coplanar with the fourth surface 24b of the second insulator 24. It is noted that the protrusion portion 12 may be a pattern corresponding to the configuration of the opening 241 from a bottom view, such as one or more of the patterns illustrated in FIGS. 2A-2O.

In addition, a metal layer 42 is formed to cover the third surface 12b of the protrusion portion 12 and the fourth surface 24b of the second insulator 24. In some embodiments, the conductive material 40 and the metal layer 42 are the same material, and are formed at substantially the same time. In other embodiments, the conductive material 40 and the metal layer 42 are formed of different materials, and/or at different times.

Figure 8H:
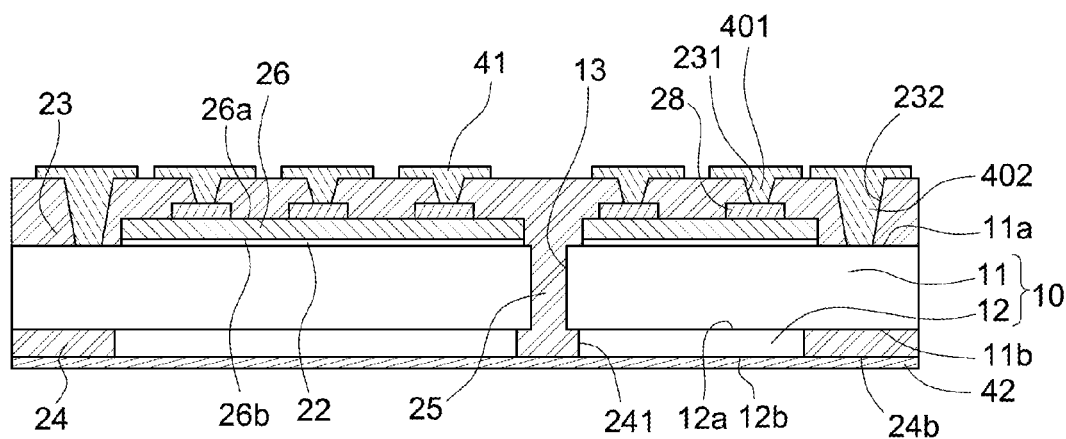

Referring to FIG. 8H, the conductive material 40 on the first insulator 23 is patterned (for example, by selectively etching) to form a first conductive pattern 41. Therefore, the first conductive pattern 41 is disposed on the first insulator 23, is electrically connected to the bonding pads 28 of the semiconductor die 26 through the first interconnection structure 401, and is electrically connected to the first surface 11a of the main portion 11 through the second interconnection structure 402.

Then, an insulating layer (e.g., insulating layer 50 of FIG. 4) is formed to cover the first insulator 23 and the first conductive pattern 41. The insulating layer defines one or more openings (e.g., openings 501 of FIG. 4) to expose a portion of the first conductive pattern 41. In some embodiments, the insulating layer is a solder mask; however, other insulating materials may be used additionally or alternatively. Then, conductive connects (e.g., conductive connects 52 of FIG. 4, such as solder balls) may be disposed in respective openings, on the exposed portion of the first conductive pattern 41, for external connection. Thus, the semiconductor package structure 3 as shown in FIG. 4 may be obtained.

FIGS. 9A-9G illustrate a method for manufacturing a semiconductor package structure according to another embodiment of the present disclosure.

Figure 9A:
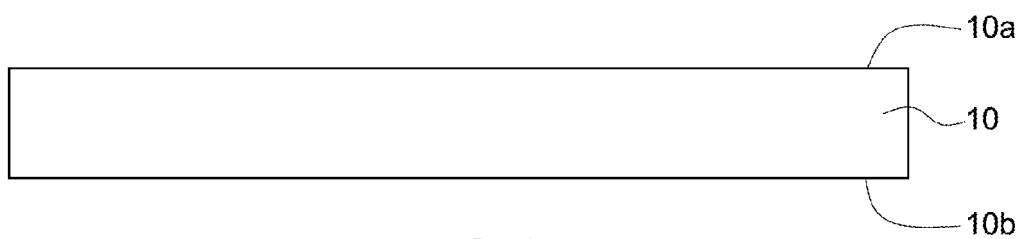
FIG. 9A, FIG. 9B, FIG. 9C, FIG. 9D, FIG. 9E, FIG. 9F and FIG. 9G illustrate a method for manufacturing a semiconductor package structure according to another embodiment of the present disclosure.

Referring to FIG. 9A, a leadframe 10 is provided. The leadframe 10 has an upper surface 10a and a lower surface 10b opposite to the upper surface 10a. The material of the leadframe 10 is, for example, copper or other metal, or a metal alloy.

Figure 9B:
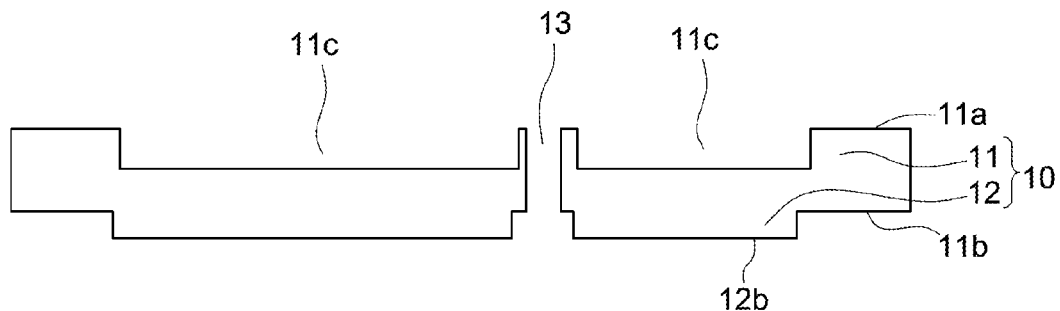

Referring to FIG. 9B, a portion of the leadframe 10 is removed so that the leadframe 10 includes a main portion 11 and a protrusion portion 12, with a trench 13. The main portion 11 has a first surface 11a, a second surface 11b and includes one or more cavities 11c. The second surface 11b is opposite to the first surface 11a. The cavity 11c is at the first surface 11a, and the position of the cavity 11c corresponds to the position of a respective protrusion portion 12. The protrusion portion 12 protrudes from the second surface 11b of the main portion 11. In some embodiments, the protrusion portion 12 is formed by etching a portion of the lower surface 10b of the leadframe 10, and the cavity 11c is formed by etching a portion of the upper surface 10a of the leadframe 10. The protrusion portion 12 and the cavity 11c may be formed at substantially the same time. The protrusion portion 12 has a third surface 12b. The protrusion portion 12 may be a pattern from a bottom view, such as one or more of the patterns illustrated in FIGS. 2A-2O. The trench 13 extends through the main portion 11.

Figure 9C:
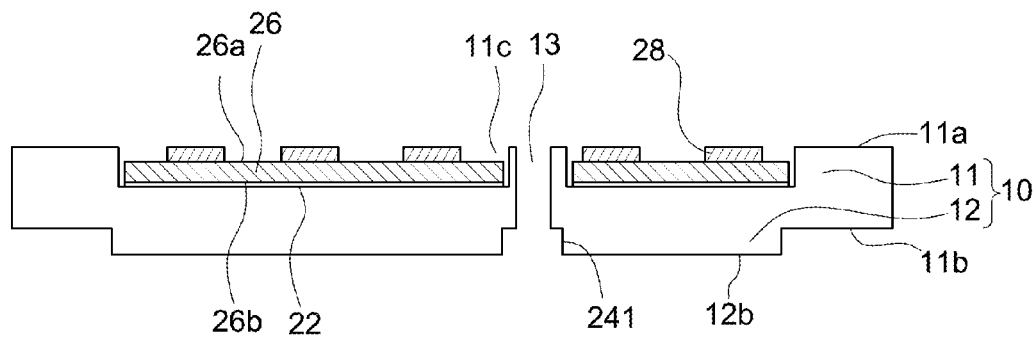

Referring to FIG. 9C, the semiconductor die 26 is bonded to the main portion 11 through a bonding layer 22. In this embodiment, the semiconductor die 26 is bonded to a bottom wall of the cavity 11c. Thus, the position of the semiconductor die 26 corresponds to the position of a respective protrusion portion 12. The semiconductor die 26 has an active surface 26a, a back surface 26b, and one or more bonding pads 28 disposed on the active surface 26a. In some embodiments, the back surface 26b of the semiconductor die 26 is bonded to the main portion 11 through the bonding layer 22 by eutectic bonding. The bonding layer 22 may include gold, tin, or a eutectic alloy thereof. In the embodiment of FIG. 9C, a top surface of the bonding pad 28 is substantially coplanar with the first surface 11a of the main portion 11.

Figure 9D:
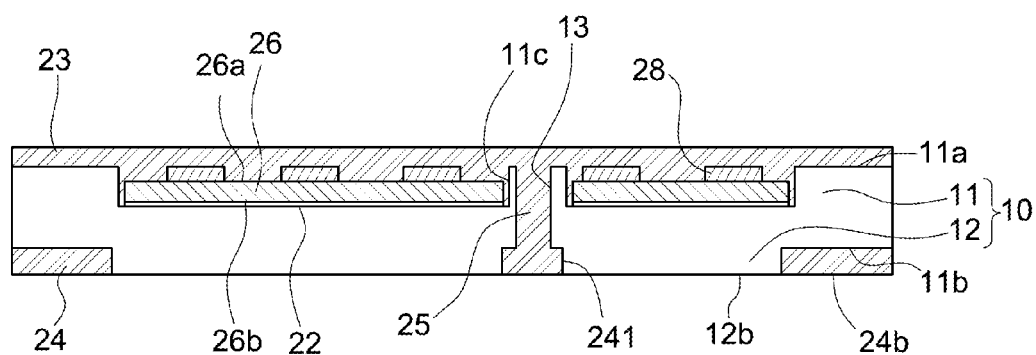

Referring to FIG. 9D, a first insulator 23 is formed to cover the semiconductor die 26 and a portion of the first surface 11a of the main portion 11. In some embodiments, the first insulator 23 may further enter the space between the side walls of the cavity 11c and the semiconductor die 26. A second insulator 24 is formed to cover a portion of the second surface 11b of the main portion 11, and has an opening 241 in which the protrusion portion 12 is disposed. The second insulator 24 has a fourth surface 24b. A third insulator 25 is formed in the trench 13. In some embodiments, the first insulator 23, the second insulator 24 and the third insulator 25 are the same material, such as polypropylene, and are formed at substantially the same time. That is, the first insulator 23 further enters the trench 13 and covers a portion of the second surface 11b of the main portion 11, and the protrusion portion 12 is exposed from the first insulator 23. In other embodiments, the first insulator 23, the second insulator 24 and the third insulator 25 may be different materials, and/or formed at different times. It is noted that the opening 241 may be a pattern corresponding to the configuration of the protrusion portion 12 from a bottom view.

Figure 9E:
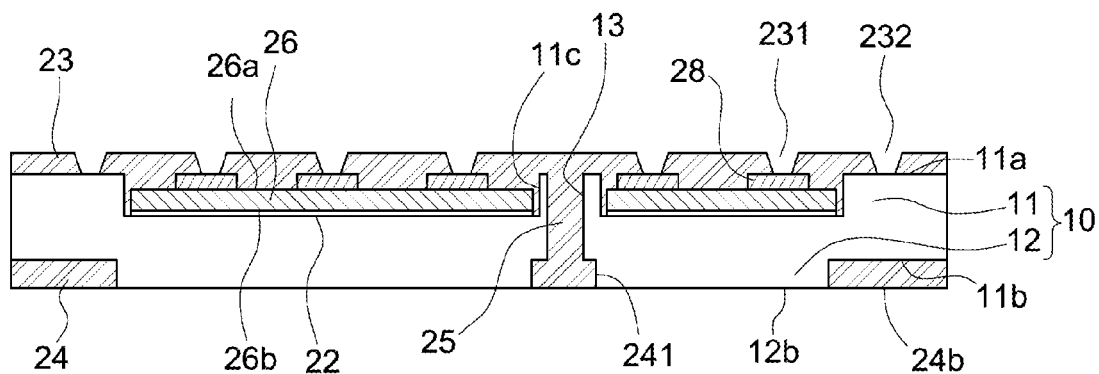

Referring to FIG. 9E, one or more first openings 231 and one or more second openings 232 are formed in the first insulator 23. The first openings 231 expose the bonding pads 28 of the semiconductor die 26, and the second openings 232 expose the first surface 11a of the main portion 11. For example, the first openings 231 and the second openings 232 are formed by laser drilling. In this embodiment, because a top surface of the bonding pad 28 is substantially coplanar with the first surface 11a of the main portion 11, the configuration of the first opening 231 may be same as that of the second opening 232, which facilitates the hole-forming process (e.g., a laser drilling process).

Figure 9F:
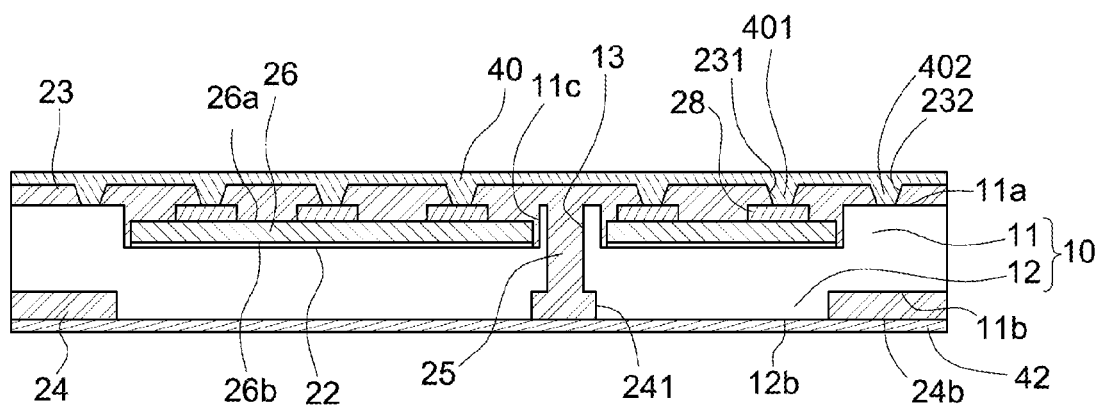

Referring to FIG. 9F, a conductive material 40 (e.g., copper) is formed on the first insulator 23, in the first openings 231 and in the second openings 232; for example, by plating. The portion of the conductive material 40 that is disposed in a first opening 231 is defined as a first interconnection structure 401, and the portion of the conductive material 40 that is disposed in a second opening 232 is defined as a second interconnection structure 402. In addition, a metal layer 42 is formed to cover the third surface 12b of the protrusion portion 12 and the fourth surface 24b of the second insulator 24. In some embodiments, the conductive material 40 and the metal layer 42 are the same material, and are formed at substantially the same time. In other embodiments, the conductive material 40 and the metal layer 42 are formed of different materials, and/or at different times.

Figure 9G:
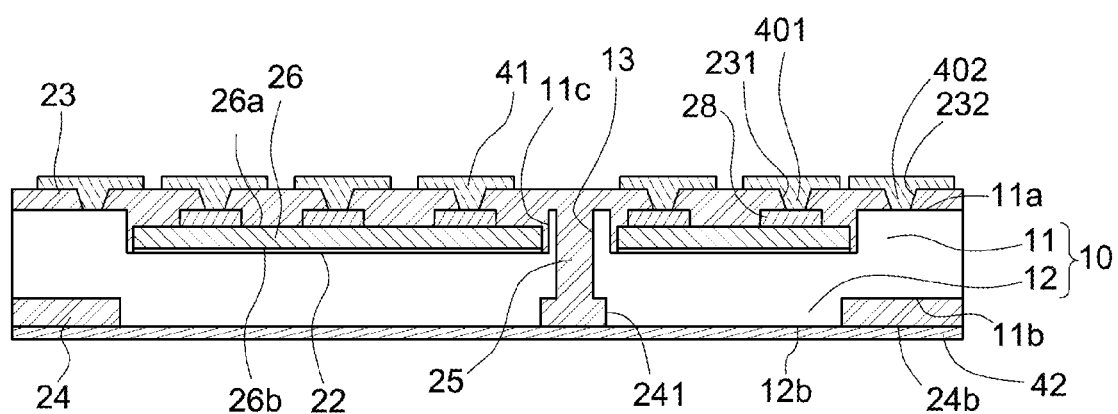

Referring to FIG. 9G, the conductive material 40 is patterned (for example, by selectively etching) to form a first conductive pattern 41. Therefore, the first conductive pattern 41 is disposed on the first insulator 23, is electrically connected to the bonding pads 28 of the semiconductor die 26 through the first interconnection structure 401, and is electrically connected to the first surface 11a of the main portion 11 through the second interconnection structure 402.

Then, an insulating layer (e.g., insulating layer 50 in FIG. 5) may be formed to cover the first insulator 23 and the first conductive pattern 41. The insulating layer may define one or more openings (e.g., openings 501 in FIG. 5) to expose a portion of the first conductive pattern 41. In some embodiments, the material of the insulating layer may be a solder mask; however, other insulating materials may be used additionally or alternatively. Then, conductive connects (e.g., conductive connects 52 in FIG. 5, such as solder balls) may be disposed in respective openings, on the exposed portion of the first conductive pattern 41, for external connection. Thus, the semiconductor package structure 4 as shown in FIG. 5 may be obtained.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 10 μm, or no greater than 15 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale.

There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a leadframe comprising:
     a main portion having a first surface and a second surface; and
     a protrusion portion protruding from the second surface of the main portion;
   a semiconductor die bonded to the main portion, wherein a position of the protrusion portion corresponds to a position of the semiconductor die and the protrusion portion protrudes from the second surface of the main portion below the die;
   a first insulator covering the semiconductor die and a portion of the first surface of the main portion; and
   a conductive pattern disposed on the first insulator and electrically connected to the semiconductor die.

2. The semiconductor package structure according to claim 1, wherein the semiconductor die is bonded to the main portion by eutectic bonding.

3. The semiconductor package structure according to claim 1, further comprising a second insulator covering a portion of the second surface of the main portion, wherein the protrusion portion is exposed from the second insulator.

4. The semiconductor package structure according to claim 3, wherein the first insulator and the second insulator are formed of the same material.

5. The semiconductor package structure according to claim 3, further comprising a metal layer covering the second insulator and the protrusion portion.

6. The semiconductor package structure according to claim 1, wherein the main portion and the protrusion portion are integrally formed.

7. The semiconductor package structure according to claim 1, wherein the protrusion portion is plated on the main portion.

8. The semiconductor package structure according to claim 1, wherein the protrusion portion is a pattern selected from a group consisting of a plurality of parallel strips, a plurality of parallel strips within a frame, a plurality of crossed strips, a plurality of crossed strips within a frame, two strips perpendicular to one another, two strips intersecting each other, a plurality of dots arranged in an array, a spiral strip, a snake-shaped strip, a diamond, a plurality of squares, a plurality of circles connecting with strips, and a circle.

9. The semiconductor package structure according to claim 1, wherein the main portion defines a cavity recessed below the first surface thereof, and the semiconductor die is disposed in the cavity.

10. A semiconductor package structure, comprising:
    a leadframe having a first thickness at a first position and a second thickness at a second position, wherein the first position is different from the second position, and the first thickness is greater than the second thickness;
    a semiconductor die bonded to the leadframe at a first surface of the leadframe, wherein the first position corresponds to a position of the semiconductor die, and the first position is below the semiconductor die at a second surface of the leadframe opposite the first surface;
    a first insulator covering the semiconductor die and a portion of the first surface of the leadframe; and
    a conductive pattern disposed on the first insulator and electrically connected to the semiconductor die.

11. The semiconductor package structure according to claim 10, wherein the semiconductor die is bonded to the leadframe by eutectic bonding.

12. The semiconductor package structure according to claim 10, further comprising a second insulator covering a portion of the second surface of the leadframe, wherein a portion of the leadframe is exposed from the second insulator.

13. The semiconductor package structure according to claim 10, wherein the leadframe defines a cavity, and the semiconductor die is disposed in the cavity.

14. The semiconductor package structure according to claim 1, wherein the protrusion portion is a plurality of parallel strips.

* * * * *